(12) United States Patent
Cao et al.

(10) Patent No.: US 12,538,665 B2
(45) Date of Patent: Jan. 27, 2026

(54) DISPLAY SUBSTRATE AND MANUFACTURING METHOD THEREFOR, AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Xilei Cao, Beijing (CN); Yingsong Xu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 541 days.

(21) Appl. No.: 17/770,614

(22) PCT Filed: Jun. 2, 2021

(86) PCT No.: PCT/CN2021/097936
§ 371 (c)(1),
(2) Date: Apr. 20, 2022

(87) PCT Pub. No.: WO2021/254150
PCT Pub. Date: Dec. 23, 2021

(65) Prior Publication Data
US 2022/0293704 A1 Sep. 15, 2022

(30) Foreign Application Priority Data
Jun. 15, 2020 (CN) .......................... 202010542262.6

(51) Int. Cl.
*H10K 59/123* (2023.01)
*H10K 59/122* (2023.01)
(Continued)

(52) U.S. Cl.
CPC ......... *H10K 59/123* (2023.02); *H10K 59/122* (2023.02); *H10K 59/1201* (2023.02); *H10K 59/80516* (2023.02); *H10K 59/80522* (2023.02)

(58) Field of Classification Search
None
See application file for complete search history.

(56) References Cited

U.S. PATENT DOCUMENTS

| | | | | |
|---|---|---|---|---|
| 4,871,619 A | * | 10/1989 | Araps | ............... H01L 21/02118 522/174 |
| 2015/0008400 A1 | | 1/2015 | Kim | |

(Continued)

FOREIGN PATENT DOCUMENTS

| | | |
|---|---|---|
| CN | 110534660 A | 12/2019 |
| CN | 110718571 A | 1/2020 |

(Continued)

OTHER PUBLICATIONS

International Search Report for PCT/CN2021/097936 Mailed Jul. 26, 2021.

(Continued)

*Primary Examiner* — Bradley Smith
(74) *Attorney, Agent, or Firm* — Ling Wu; Stephen Yang; Ling and Yang Intellectual Property

(57) ABSTRACT

A display substrate and a manufacturing method therefor, and a display device. The manufacturing method for the display substrate includes: forming a substrate, and forming a driving structural layer on the substrate, the driving structural layer including a thin film transistor; forming a planarization layer on the side of the driving structural layer away from the substrate, curing and polishing and planishing the planarization layer, and then forming a first via hole penetrating through the planarization layer and exposing a first pole of the thin film transistor; and forming a light (Continued)

emitting structural layer on the side of the planarization layer away from the substrate.

12 Claims, 8 Drawing Sheets

(51) Int. Cl.
  *H10K 59/12* (2023.01)
  *H10K 59/80* (2023.01)

(56) References Cited

U.S. PATENT DOCUMENTS

| | | |
|---|---|---|
| 2016/0043341 A1 | 2/2016 | Heo et al. |
| 2017/0133620 A1* | 5/2017 | Lee ......................... H10K 71/00 |
| 2017/0230638 A1* | 8/2017 | Wajs .................... H04N 13/254 |
| 2017/0293224 A1 | 10/2017 | Kamemoto et al. |
| 2021/0091345 A1* | 3/2021 | Kishimoto ............. H05B 33/22 |
| 2022/0146895 A1* | 5/2022 | Itou ........................... G09F 9/30 |
| 2022/0293704 A1 | 9/2022 | Cao et al. |

FOREIGN PATENT DOCUMENTS

| | | |
|---|---|---|
| CN | 111668158 A | 9/2020 |
| WO | 2019202738 A1 | 10/2019 |

OTHER PUBLICATIONS

Office Action dated Mar. 25, 2022 for Chinese Patent Application No. 202010542262.6 and English Translation.

\* cited by examiner

DISPLAY SUBSTRATE AND MANUFACTURING METHOD THEREFOR, AND DISPLAY DEVICE

CROSS-REFERENCE TO RELATED APPLICATIONS

The present application is a U.S. National Phase Entry of International Application No. PCT/CN2021/097936 having an international filing date of Jun. 2, 2021, which claims the priority of Chinese Patent Application No. 202010542262.6, filed to the CNIPA on Jun. 15, 2020 and entitled "Display Substrate and Manufacturing Method therefor, and Display Device". The above-identified applications are hereby incorporated by reference.

TECHNICAL FIELD

Embodiments of the present disclosure relate to, but are not limited to display technologies, in particular to a display substrate and a manufacturing method thereof, and a display device.

BACKGROUND

In recent years, Organic Light-Emitting Diode (OLED) screen has attracted wide attention for its light weight, excellent display effect, high contrast, wide color gamut, flexibility and other advantages, and is considered as the next generation display solution that is expected to replace liquid crystal. With the demand for full screen, the technology of screen thickness reduction is increasingly welcomed by consumers.

SUMMARY

The following is a summary of subject matters described herein in detail. The summary is not intended to limit the protection scope of claims.

Embodiments of the present disclosure provide a display substrate and a manufacturing method thereof, and a display device.

In one aspect, an embodiment of the disclosure provides a method for manufacturing a display substrate, which comprises the following acts: forming a substrate, and forming a drive structure layer on the substrate, wherein the drive structure layer comprises a thin film transistor; forming a planarization layer on a side of the drive structure layer away from the substrate, forming a first via penetrating through the planarization layer and exposing the first electrode of the thin film transistor after curing, polishing and planishing the planarization layer; and forming a light-emitting structure layer on a side of the planarization layer away from the substrate.

In an exemplary embodiment, before forming the light-emitting structure layer on the side of the planarization layer away from the substrate, the method further comprises: forming an auxiliary layer between the planarization layer and the light-emitting structure layer.

In an exemplary embodiment, the forming of the first via penetrating the planarization layer and exposing the first electrode of the thin film transistor comprises: using the auxiliary layer as a mask to etch and form the first via.

In an exemplary embodiment, a material of the auxiliary layer comprises metal.

In an exemplary embodiment, the forming of the auxiliary layer between the planarization layer and the light-emitting structure layer comprises: forming the auxiliary layer comprising a first auxiliary electrode and a second auxiliary electrode independent of each other between the planarization layer and the light-emitting structure layer; and the forming of a light-emitting structure layer on the side of the planarization layer away from the substrate comprises: forming a first electrode on a side of the auxiliary layer away from the substrate, wherein the first electrode is electrically connected to the first auxiliary electrode and the first electrode of the thin film transistor; forming a pixel define layer on a side of the first electrode away from the substrate, wherein the pixel define layer is provided with a second via exposing the second auxiliary electrode; and sequentially forming an organic light-emitting layer and a second electrode on a side of the pixel define layer away from the substrate, wherein the second electrode is electrically connected to the second auxiliary electrode through the second via.

In an exemplary embodiment, a material of the planarization layer comprises a black material.

In yet another aspect, an embodiment of the present disclosure further provides a display substrate comprising a substrate, and a drive structure layer, a planarization layer and a light-emitting structure layer sequentially disposed on the substrate; wherein the drive structure layer comprises a thin film transistor comprising a first electrode, the planarization layer is provided with a first via exposing the first electrode of the thin film transistor, and the first via is formed after the curing, polishing and planishing of the planarization layer.

In an exemplary embodiment, the display substrate further comprises an auxiliary layer disposed between the planarization layer and the light-emitting structure layer.

In an exemplary embodiment, a material of the auxiliary layer comprises metal.

In an exemplary embodiment, the auxiliary layer comprises a first auxiliary electrode; and the light-emitting structure layer comprises a first electrode, a pixel define layer, an organic light-emitting layer and a second electrode arranged in sequence from a side close to the auxiliary layer to a side away from the auxiliary layer, wherein, the first electrode is electrically connected to the first electrode of the thin film transistor through the first via, and the first electrode is electrically connected to the first auxiliary electrode.

In an exemplary embodiment, the auxiliary layer comprises a first auxiliary electrode and a second auxiliary electrode which are independent of each other; the light-emitting structure layer comprises a first electrode, a pixel define layer, an organic light-emitting layer and a second electrode arranged in sequence from a side close to the auxiliary layer to a side away from the auxiliary layer, wherein, the first electrode is electrically connected to the first electrode of the thin film transistor through the first via, and the first electrode is electrically connected to the first auxiliary electrode; the pixel define layer is provided with a second via exposing the second auxiliary electrode; and the second electrode is electrically connected to the second auxiliary electrode through the second via.

In an exemplary embodiment, the first electrode is disposed on the surface of the first auxiliary electrode.

In an exemplary embodiment, a material of the planarization layer comprises a black material.

In an exemplary embodiment, a material of the planarization layer comprises a non-photosensitive material.

In yet another aspect, an embodiment of the present disclosure provides a display device, which comprises the display substrate described above.

Other features and advantages of the embodiments of the present disclosure will be set forth in the following specification, and in part will become apparent from the specification, or be learned by practice of embodiments of the present disclosure. Purposes and advantages of the embodiments of the present disclosure may be achieved and acquired by structures specified in the detailed description and drawings.

Other aspects may be understood upon reading and understanding of the accompanying drawings and detailed descriptions.

BRIEF DESCRIPTION OF DRAWINGS

Accompanying drawings are used to provide a further understanding of solutions of embodiments of the present disclosure, constitute a part of the specification to explain technical solutions together with embodiments of the present disclosure, and do not constitute limitations on the technical solutions.

DETAILED DESCRIPTION

Figure 1:
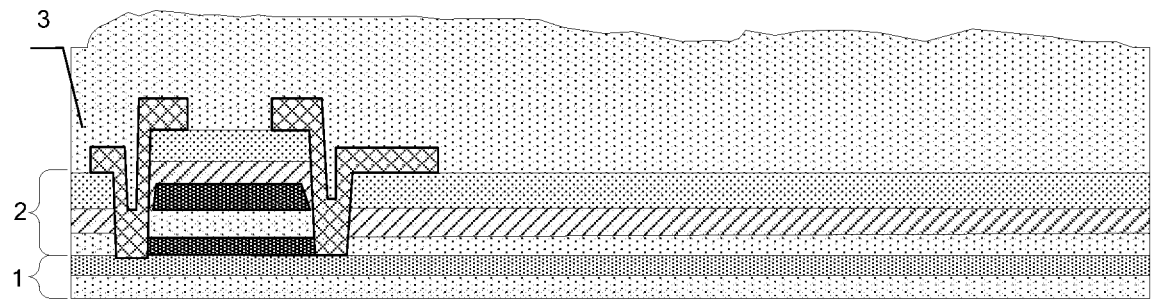
FIG. 1 is a schematic diagram of a display substrate according to a technical solution.

Hereinafter embodiments of the present disclosure will be described in detail with reference to the accompanying drawings. The embodiments in the present disclosure and features in the embodiments may be combined randomly with each other if there is no conflict.

Acts shown in a flowchart of the drawings may be performed in a computer system such as a set of computer executable instructions. Moreover, although a logical sequence is shown in the flowchart, in some cases, the acts shown or described may be performed in a sequence different from that shown.

Unless otherwise defined, technical terms or scientific terms used in the present invention should have the common meaning understood by those skilled in the art of the present disclosure. The "first," "second," and similar terms used in the present disclosure do not indicate any order, number, or importance, but are used only for distinguishing different components. "Comprise", "contain", or similar words mean that elements or objects appearing before the words cover elements or objects listed after the words and their equivalents, but do not exclude other elements or objects. Terms like "connect" or "mutually connect" are not limited to physical or mechanical connection, but may comprise electrical connection, whether direct or indirect. "Upper", "lower", "left", "right", etc., are used to represent relative positional relations, and when an absolute position of a described object is changed, the relative positional relation may also be correspondingly changed.

In the specification, a transistor refers to a component which at least comprises three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. In this specification, the channel region refers to a region which the current mainly flows through.

In this specification, it may be the case that a first electrode is a drain electrode and a second electrode is a source electrode, and it may alternatively be the case that a first electrode is a source electrode and a second electrode is a drain electrode. In cases that transistors with opposite polarities are used, a current direction changes during work of a circuit, or the like, functions of the "source electrode" and the "drain electrode" may sometimes be exchanged. Therefore, the "source electrode" and the "drain electrode" may be exchanged in the present specification.

In this specification, a first electrode may be an anode and a second electrode may be a cathode; alternatively the first electrode may be a cathode and the second electrode may be an anode, depending on the light-emitting structure of the display substrate.

In organic light-emitting display substrates, coating RGB color filters (red, green and blue color filters) is usually used instead of Polarizer (POL). However, due to the influence of process level, the uneven anode will cause color separation and uneven display.

FIG. 1 is a schematic diagram of a display substrate according to a technical solution. As shown in FIG. 1, the display substrate comprises a substrate 1, a drive structure layer 2 and a planarization layer 3, wherein the drive structure layer 2 comprises a thin film Transistor (TFT). Because of the influence of the regionalized TFT design, even when the planarization layer 3 region above the TFT adopts a leveling design, the height here is 0.2 microns (μm) to 1.2 microns higher than other regions due to process bias (floating), resulting in unevenness of the planarization layer 3, resulting in color separation and uneven display. In addition, in this design, the planarization layer 3 has to undergo thermal baking and curing after perforation design, which will cause a change of aperture ratio, ranging from 1% to 10%. A larger change of aperture ratio will cause the change of contact resistance between anode and thin film transistor, which affects the display effect.

The embodiment of the present disclosure provides a display substrate, a manufacturing method therefor, and a display device to meet the requirement of making an anode flat, which prevents a color separation phenomenon caused by an uneven anode during the design of a Color Filter on Encapsulation (COE), and to ensure an aperture ratio.

Figure 2:
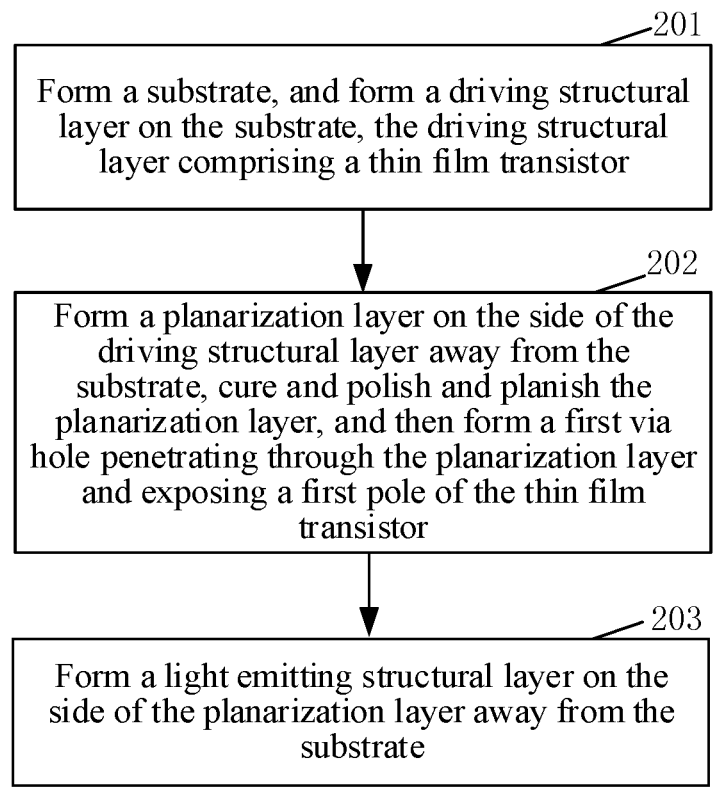
FIG. 2 is a flowchart of a method for manufacturing a display substrate according to an embodiment.

FIG. 2 is a flowchart of a method for manufacturing a display substrate according to an embodiment of the present disclosure. As shown in FIG. 2, a method for manufacturing a display substrate according to an embodiment of the present disclosure may comprise:

In step 201, a substrate is formed, and a drive structure layer is formed on the substrate, wherein the drive structure layer comprises a thin film transistor, and the thin film transistor comprises a first electrode;

In step 202, a planarization layer is formed on a side of the drive structure layer away from the substrate, after curing, polishing and planishing the planarization layer, a first via penetrating through the planarization layer and exposing the first electrode of the thin film transistor is formed; and In step 203, a light-emitting structure layer is formed on a side of the planarization layer away from the substrate.

According to the solution provided by the embodiment, the planarization layer is cured, polished and planished, thereby improving the flatness of the planarization layer, preventing uneven display caused by color separation and improving the display effect. In addition, punching holes after curing, polishing and planishing can prevent the residue of polishing agent (being acid or alkali that may cause corrosion to some extent, thereby affecting TFT characteristics). On the other hand, compared with punching holes before curing, the change of aperture may be reduced, the influence on the contact resistance may be avoided and thus improving display effect.

In an exemplary embodiment, the first electrode is, for example, a drain electrode. But the embodiment of the present disclosure is not limited thereto, and the first electrode may be a source electrode when the structure of the display substrate is changed.

In an exemplary embodiment, before forming a light-emitting structure layer on a side of the planarization layer away from the substrate, the method may further comprise: forming an auxiliary layer between the planarization layer and the light-emitting structure layer. The auxiliary layer may be insulated, conductive, or partially insulated and partially conductive, etc. In other embodiments, there may be no auxiliary layer. The auxiliary layer may be used as an auxiliary electrode or as a mask in a subsequent process.

In an exemplary embodiment, forming of a first via penetrating the planarization layer and exposing the first electrode of the thin film transistor may comprise: using the auxiliary layer as a mask to implement etching and form the first via. The auxiliary layer is formed before the first via is formed. In this embodiment, the auxiliary layer is used as a mask, which may simplify the manufacturing process and reduce the cost. In another embodiment, the auxiliary layer may not be used as a mask.

In an exemplary embodiment, a material of the auxiliary layer may comprise metal. When the auxiliary layer is made of metal, it may be used as an auxiliary electrode, for example, used as an auxiliary electrode of an anode, used as an auxiliary electrode of a cathode, or used as auxiliary electrodes of the anode and the cathode. In this embodiment, the IR drop may be reduced by using the auxiliary electrode. In other embodiments, the auxiliary layer may be nonmetallic.

In an exemplary embodiment, the auxiliary layer may comprise a first auxiliary electrode and a second auxiliary electrode which are independent of each other; forming of a light-emitting structure layer on a side of the planarization layer away from the substrate may comprise: forming a first electrode on a side of the auxiliary layer away from the substrate, wherein the first electrode may electrically connect the first auxiliary electrode and the first electrode of the thin film transistor; forming a pixel define layer on a side of the first electrode away from the substrate, wherein the pixel define layer is provided with a second via exposing the second auxiliary electrode; and sequentially forming an organic light-emitting layer and a second electrode on a side of the pixel define layer away from the substrate, wherein the second electrode is electrically connected to the second auxiliary electrode through the second via. In this embodiment, the auxiliary layer is used as the auxiliary electrode of the first electrode and the auxiliary electrode of the second electrode, thereby reducing the IR Drop. In another embodiment, there may be only the first auxiliary electrode.

The process of manufacturing the display substrate will be described below through an example. The "patterning process" described in the embodiments comprises processing such as depositing of a film layer, coating with a photoresist, mask exposure, development, etching, and stripping of the photoresist. The "lithography process" described in the embodiments comprises processing such as coating of a film layer, mask exposure, and development. Evaporation, deposition, coating, etc. mentioned in this embodiment are all mature preparation processes in related art.

Figure 3:
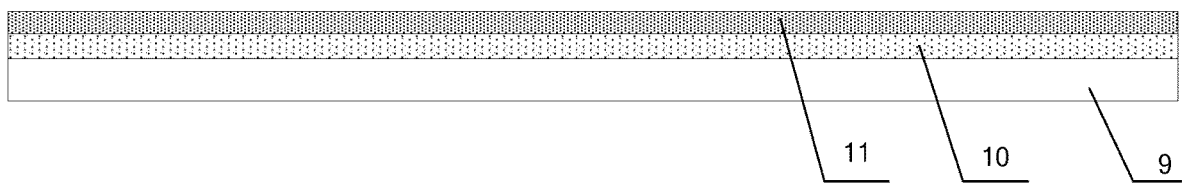
FIG. 3 is a schematic diagram after a pattern of a substrate is formed according to an embodiment.

FIGS. 3 to 12 are schematic diagrams showing a manufacturing process of a display substrate according to the embodiments. The manufacturing process of the display substrate may comprise:

(1) A pattern of a substrate is formed. The forming of the pattern of the substrate comprises: A layer of flexible material is coated on a glass carrier plate 9, and is cured to form a film to form the first substrate 10. A layer of buffer thin film is deposited on the first substrate 10 to form a pattern of the buffer layer 11 covering the entire first substrate 10. Wherein, the flexible material may be Pressure Sensitive Adhesive (PSA), Polyimide (PI), Polyethylene Terephthalate (PET), or other materials such as a polymer soft thin film subjected to surface treatment, which is used to form a flexible substrate as shown in FIG. 3. The buffer thin film may be made of silicon nitride (SiNx), silicon oxide (SiOx), or the like, it may be a single layer or may be a multi-layer structure of silicon nitride/silicon oxide.

(2) Patterns of an active layer, a gate electrode, a source electrode and drain electrode are formed on the substrate.

Figure 4:
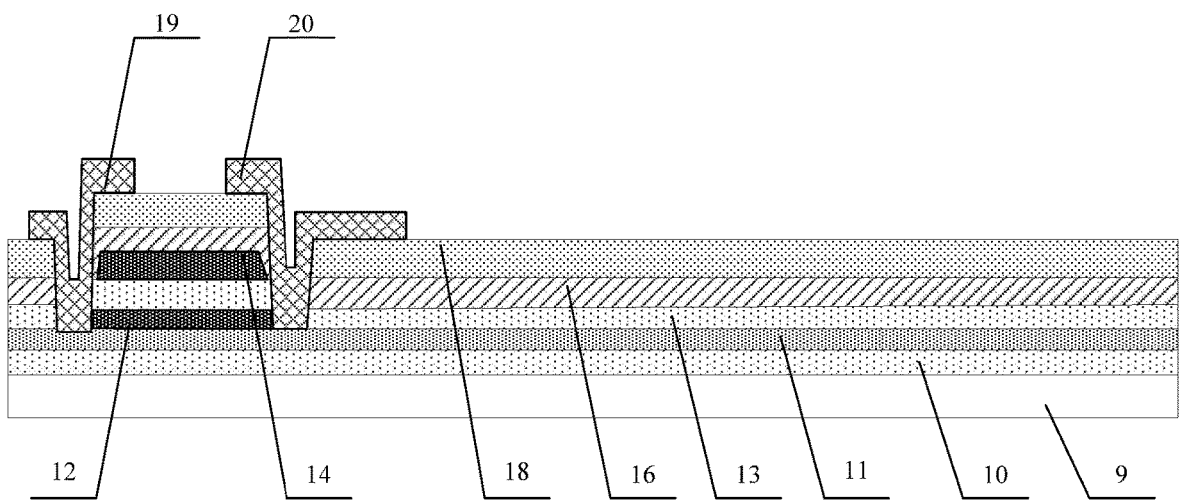
FIG. 4 is a schematic diagram after a drive structure layer is formed according to an embodiment.

As shown in FIG. 4, the forming of patterns of the active layer, the gate electrode, the source electrode and drain electrode on the substrate comprises:

On the basis of forming the above structure, an active layer thin film is deposited, and the active layer thin film is patterned through a patterning process to form a pattern of the active layer 12 disposed on the buffer layer 11 in the display region.

A first insulating thin film and a first metal thin film are sequentially deposited, and the first metal thin film is patterned through a patterning process to form patterns of a first insulating layer 13 covering the active layer 12, a first gate electrode 14, a second gate electrode (not shown in the drawings) and a gate line (not shown in the drawings) disposed on the first insulating layer 13.

A second insulating thin film and a second metal thin film are sequentially deposited, and the second metal thin film is patterned through a patterning process to form a pattern of a second insulating layer 16 covering the first gate electrode 14 and the second gate electrode 15, and a pattern of a capacitance electrode (not shown in the drawings) disposed on the second insulating layer 16, herein a position of the capacitance electrode corresponds to a position of the second gate electrode, and the capacitance electrode and the second gate electrode together form a capacitor.

On the basis of forming the above structure, a third insulating thin film is deposited and is patterned through a patterning process to form a pattern of a third insulating layer 18 provided with a via in the display region. The third insulating thin film 18, the second insulating thin film 16 and the first insulating thin film 13 in the via are etched away to expose the active layer 12.

A third metal thin film is deposited and is patterned through a patterning process to form patterns of a source electrode 19, a drain electrode 20 and a data line (not shown in the drawings) in the display region. Herein, the source electrode 19 and the drain electrode 20 are respectively connected to the active layer 12 through the via.

Through the above process, the drive structure layer of the display region is manufactured on the substrate. The drive structure layer comprises an active layer 12, a first gate electrode 14, a second gate electrode, a capacitor electrode, a source electrode 19, a drain electrode 20, a gate line, and a data line. Herein, the gate line and the data line are vertically intersected to define a sub-pixel, and a thin film transistor formed by the active layer 12, the first gate electrode 14, the source electrode 19 and the drain electrode 20 is disposed in the sub-pixel. The first insulating layer 13 and the second insulating layer 16 may be referred to as Gate Insulating (GI) layers, and the third insulating layer 18 may be referred to as an interlayer insulating layer (ILD).

(3) A pattern of a planarization layer is formed.

Figure 5:
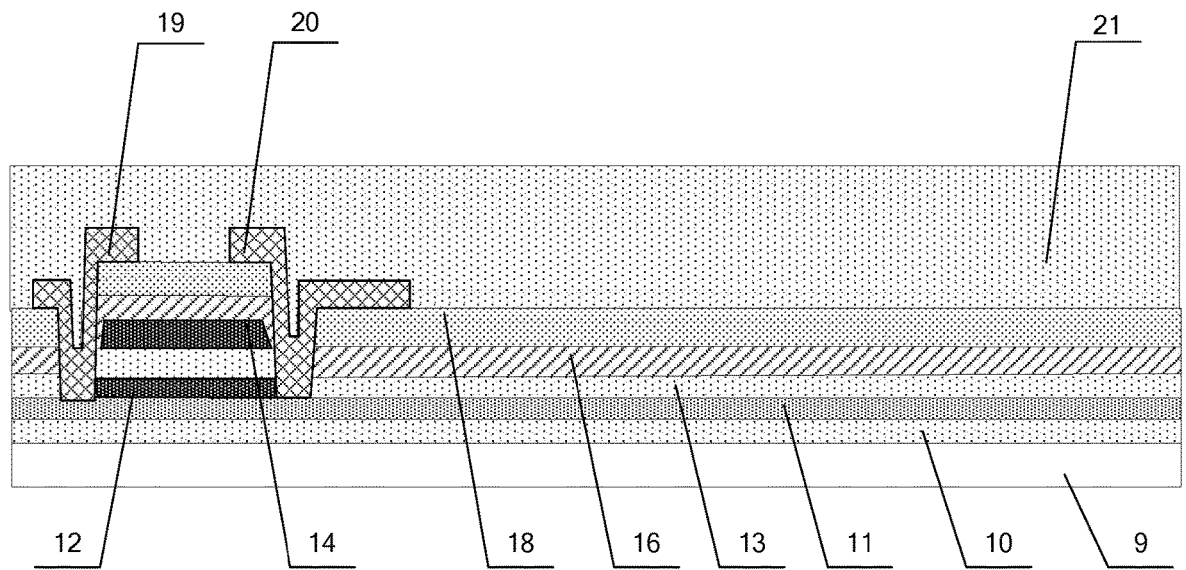
FIG. 5 is a schematic diagram after a planarization layer is formed according to an embodiment.

The forming of the pattern of the planarization layer comprises: On the basis of forming the above structure, a fourth insulating thin film is coated, baked, cured, polished and planished to form a pattern of a planarization layer 21 covering the source electrode 19 and the drain electrode 20, as shown in FIG. 5. In this embodiment, the flatness can be improved through polishing and planishing, so that the flatness of subsequent formed anodes is correspondingly improved.

In an exemplary embodiment, polishing and planishing may be performed using a chemical (using a polishing agent) or a mechanical manner.

In an exemplary embodiment, the fourth insulating thin film may be made of a black material to prevent illumination from affecting the gate traces, which can reduce the reflectivity of the wirings. Black materials here comprise black and near-black materials. The black material comprises, for example, black PI, siloxane-based binders, or black pigments, dyes, etc. Embodiments of the present disclosure are not limited thereto and non-black materials such as transparent materials, non-black anti-reflective materials and the like may be used.

In an exemplary embodiment, the fourth insulating thin film may be made of a non-photosensitive material, which can reduce the cost due to the high cost of the photosensitive material. Conventional materials for planarization layer contain a photosensitive material, and therefore a planarization layer may be fabricated using a material that does not contain a photosensitive material. The fourth insulating thin film may be made of a black non-photosensitive material or a non-black non-photosensitive material.

(4) A pattern of an auxiliary layer is formed.

Figure 6:
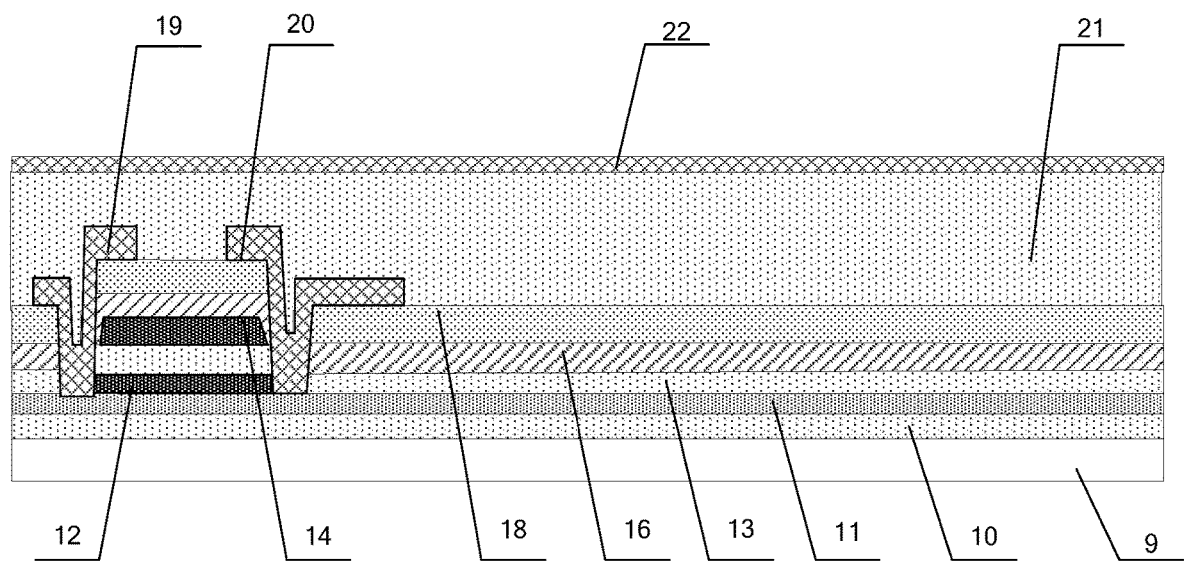
FIG. 6 is a schematic diagram after a deposition auxiliary layer is formed according to an embodiment.

The forming of the pattern of the auxiliary layer comprises: An auxiliary layer thin film is deposited, as shown in FIG. 6. The auxiliary layer thin film is, for example, a conductive material or an insulating material, and the conductive material comprises, for example, a metal or a conductive thin film (for example, Indium Tin Oxide (ITO), Indium Zinc Oxide (IZO), etc.), the metal comprises, for example, one of a metal material such as magnesium (Mg), silver (Ag), aluminum (Al), copper (Cu), lithium (Li), or an alloy of the above metals. The insulating material comprises, for example, inorganic insulating materials such as silicon nitride (SiNx), silicon oxide (SiOx), silicon oxynitride, etc.

Figure 7:
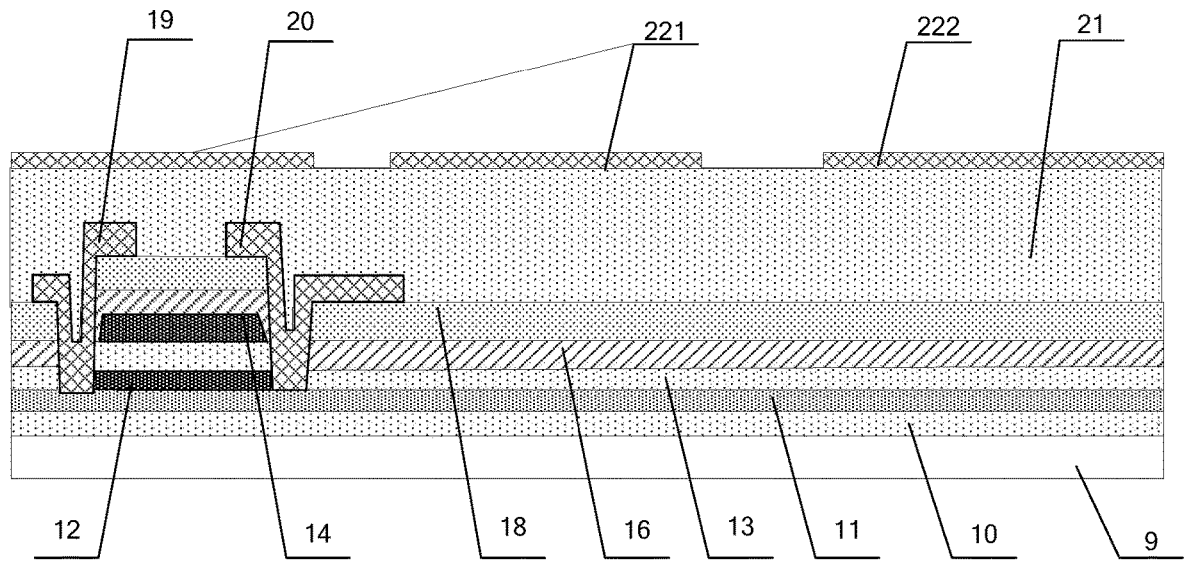
FIG. 7 is a schematic diagram after a pattern of an auxiliary layer is formed according to an embodiment.

The auxiliary layer thin film is patterned through a patterning process to form an auxiliary layer comprising a first auxiliary electrode 221 and a second auxiliary electrode 222 as shown in FIG. 7. The first auxiliary electrode 221 may be electrically connected to the anode and the second auxiliary electrode 222 may be electrically connected to the cathode, thereby reducing the IR drop. Embodiments of the present disclosure are not limited thereto. It may be that only the first auxiliary electrode 221 is electrically connected to the anode or only the second auxiliary electrode 222 is electrically connected to the cathode. When only the first auxiliary electrode 221 is electrically connected to the anode, there is no second via. When only the second auxiliary electrode 222 is electrically connected to the cathode, the auxiliary layer may be partially made of an insulating material (at a portion corresponding to the first auxiliary electrode 221) and partially made of metal (at a portion corresponding to the second auxiliary electrode 222), and the like.

Figure 8:
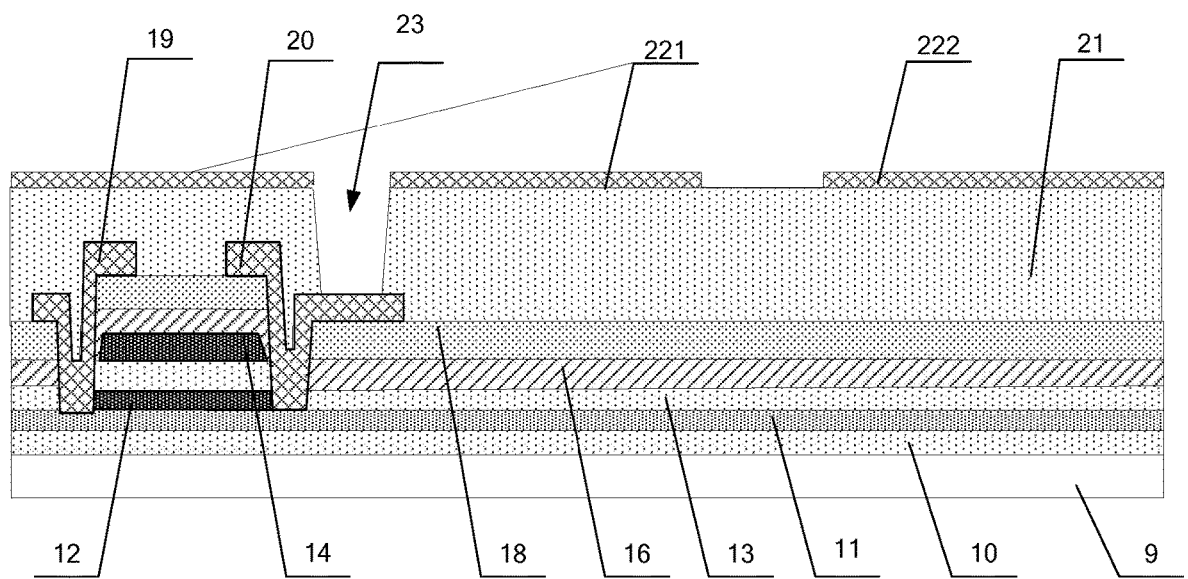
FIG. 8 is a schematic diagram after a first via is formed according to an embodiment.

An auxiliary layer is used as a mask to etch (e.g. dry-etching) and form a first via 23 penetrating the planarization layer 21; the first via exposes the drain electrode 20, as shown in FIG. 8.

In the embodiment, the auxiliary layer is used as a mask to prevent the use of an additional mask, which simplifies the process and reduces the cost. In addition, the via is formed after the planarization layer is polished and planished. Compared with polishing and planishing the planarization layer after the first via is formed, the solution provided in this embodiment does not create residual polishing agent (the polishing agent is acid or alkali, which will cause corrosion to some extent and affect TFT characteristics), and does not cause damage to the source and drain electrodes. In addition, punching holes after baking and curing will only affect the aperture ratio within 2%, which greatly reduces the change of aperture ratio, avoids the change of contact resistance between anode and drain electrode, and improves the display effect.

(5) A pattern of an anode is formed.

Figure 9:
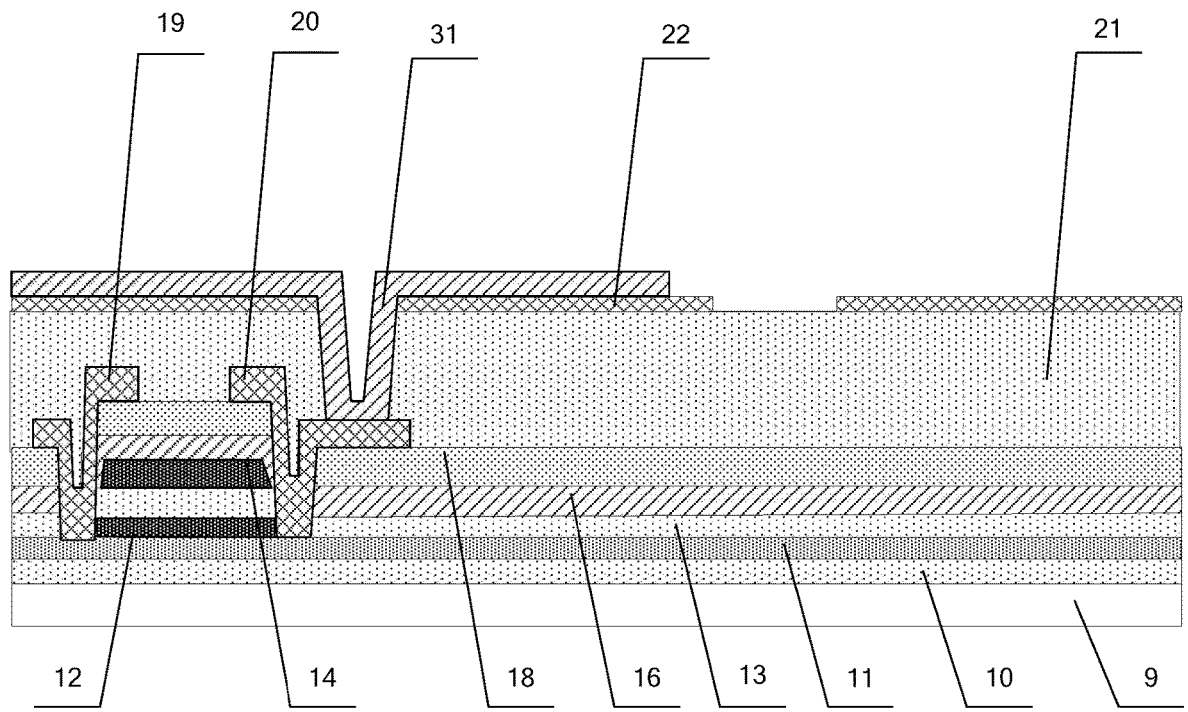
FIG. 9 is a schematic diagram after an anode is formed according to an embodiment.

A transparent conductive thin film is deposited and is patterned through a patterning process to form a pattern of an anode 31 in the display region. The anode 31 is connected to the drain electrode 20 through the first via 23, as shown in FIG. 9. The transparent conductive thin film may be ITO or IZO or ITO/Al (Aluminum)/ITO multilayer composites. In another embodiment, a second auxiliary electrode 222 may be disposed in the same layer as the anode 31.

(6) Patterns of a pixel define layer, an organic light-emitting layer and a cathode are formed.

The forming of patterns of the pixel define layer, the organic light-emitting layer and the cathode comprises: A pixel define thin film is coated on the substrate on which the aforementioned patterns are formed, and a pattern of a Pixel Define Layer (PDL) 32 is formed in the display region through a photolithography process; the pixel define layer 32 defines a pixel opening region exposing the anode 31 and the second via in each sub-pixel, and the second via exposes the second auxiliary electrode 222; wherein, the pixel define layer 32 may be made of polyimide, acrylic or polyethylene terephthalate etc.

Figure 10:
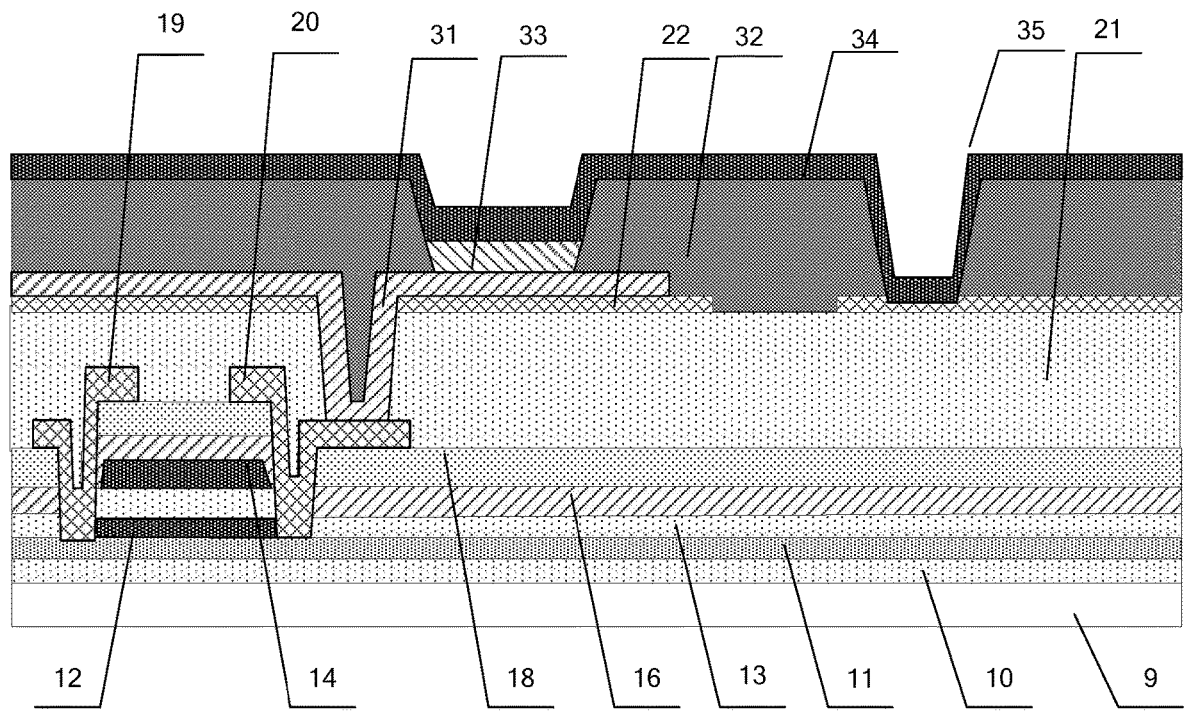
FIG. 10 is a schematic diagram after a light-emitting structure layer is formed according to an embodiment.

An organic light-emitting material and a cathode metal are sequentially evaporated to form patterns of an organic light-emitting layer 33 and a cathode 34; the organic light-emitting layer 33 is connected to the anode 31 in the pixel opening region defined by the pixel define layer 32, and the cathode 34 is disposed on the organic light-emitting layer 33 and is electrically connected to the second auxiliary electrode 222, as shown in FIG. 10. The organic light-emitting layer 33 comprises a light-emitting layer (EML). In an actual implementation, the organic light-emitting layer 33 may comprise a hole injection layer, a hole transport layer, a light-emitting layer, an electron transport layer, and an electron injection layer disposed sequentially to improve an efficiency of injecting electrons and holes into the light-emitting layer. The cathode 34 may be made of one of metal materials such as magnesium (Mg), argentum (Ag), aluminum (Al), copper (Cu), lithium (Li), or an alloy made of one or more of the above metals.

Figure 11:
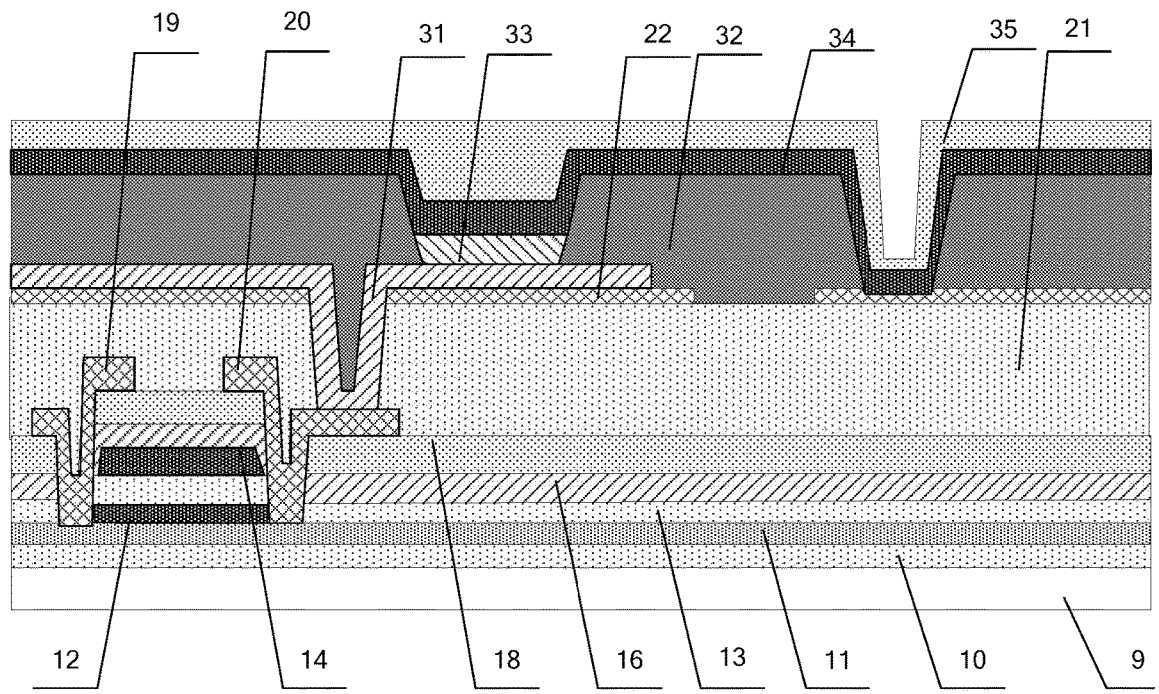
FIG. 11 is a schematic diagram after an encapsulation layer is formed according to an embodiment.

(7) A pattern of an encapsulation layer is formed. The forming of the pattern of the encapsulation layer comprises: a first inorganic thin film is deposited on a substrate on which the aforementioned patterns are formed to form a pattern of a first inorganic layer, and an organic layer is formed in a display region through ink jet printing, wherein the organic layer is only formed on the first inorganic layer in the display region. A second inorganic thin film is then deposited, which covers the display region and the non-display region to form a pattern of a second inorganic layer, as shown in FIG. 11. Here, the encapsulation layer 35 comprising an inorganic/organic/inorganic three-layer structure is completed, in which the intermediate organic layer is formed only in the display region and the upper and lower inorganic layers cover the display region and the non-display region. The first inorganic thin film is, for example, silicon oxynitride (SiON), and the second inorganic thin film is, for example, silicon nitride (SiNx).

Figure 12:
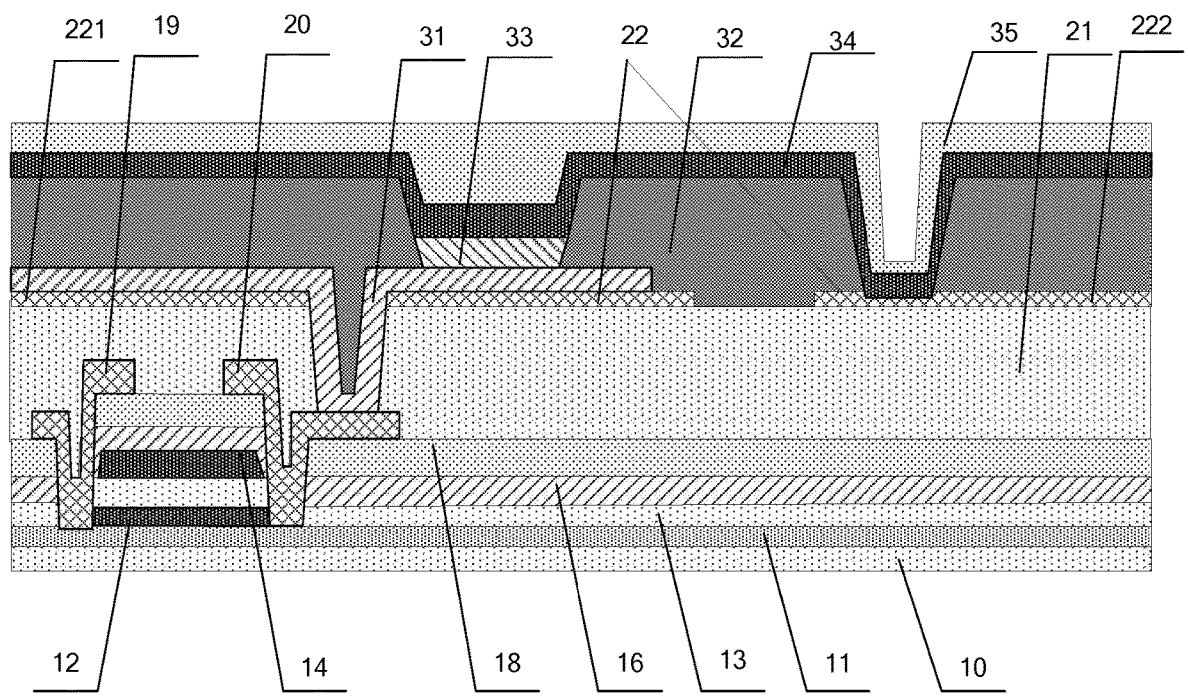
FIG. 12 is a schematic diagram of a display substrate according to an embodiment.

(8) The glass carrier plate 9 is stripped off to complete the manufacturing of the display substrate, as shown in FIG. 12.

The structure shown in present embodiment and the manufacturing process thereof are merely illustrative. In an actual implementation, corresponding structures may be changed and patterning processes may be added or reduced according to actual needs. For example, the display substrate may be not only a top emission structure, but alternatively a bottom emission structure. For another example, the thin film transistor may be a top gate structure, a bottom gate structure, or a dual gate structure, or a single gate structure. For another example, the thin film transistor may be an Amorphous Silicon (a-Si) thin film transistor, a low-temperature polysilicon (LTPS) thin film transistor or an oxide thin film transistor, and the drive structure layer and the light-emitting structure layer may be disposed with other electrodes, leads and structure film layers.

FIG. 12 is a schematic diagram of a display substrate according to another embodiment. As shown in FIG. 12, the display substrate provided in this embodiment may comprise a substrate, and a drive structure layer, a planarization layer 21, an auxiliary layer 22 and a light-emitting structure layer sequentially disposed on the substrate. The substrate may comprise a first substrate 10 and a buffer layer 11. The drive structure layer may comprise an active layer 12, a first insulating layer 13, a first gate electrode 14, a second insulating layer 16, a third insulating layer 18, a source electrode 19, and a drain electrode 20. The planarization layer 21 is provided with a first via exposing the drain electrode 20, and the first via is formed after curing, polishing and planishing the planarization layer 21. The auxiliary layer 22 may comprise a first auxiliary electrode 221 and a second auxiliary electrode 222 independent of each other, and the light-emitting structure layer may comprise an anode 31, a pixel define layer 32, an organic light-emitting layer 33, and a cathode 34. The anode 31 may be provided on a surface of the first auxiliary electrode 221 away from the substrate. The anode 31 is electrically connected to the first auxiliary electrode 221, and may be electrically connected to the drain electrode 20 through the first via. The pixel define layer 32 is provided with a second via exposing the second auxiliary electrode 222 through which the Cathode 34 may be electrically connected to the second auxiliary electrode 222.

In the display substrate provided by the embodiment, the planarization layer is cured, polished and planished, so that the planarization layer is flatter, thereby preventing color separation that causes uneven display. In addition, punching holes implemented after curing, polishing and planishing can prevent the residue of polishing agent (being acid or alkali, which may cause corrosion to some extent, thereby affecting TFT characteristics), on the other hand, compared with punching holes implemented before curing, it can reduce the change of aperture, avoid affecting contact resistance and improve display effect. In addition, the first auxiliary electrode 221 and the second auxiliary electrode 222 reduce the IR drop, and the auxiliary layer may be used as a mask in the manufacturing process, thus simplifying the manufacturing process and reducing the cost.

In an exemplary embodiment, a material of the planarization layer 21 may comprise a black material to prevent illumination from affecting the gate wiring and reduce the reflectivity.

In an exemplary embodiment, a material of the planarization layer 21 may comprise a non-photosensitive material. That is, the planarization layer 21 does not have to contain a photosensitive material, thereby reducing the cost.

Figure 13:
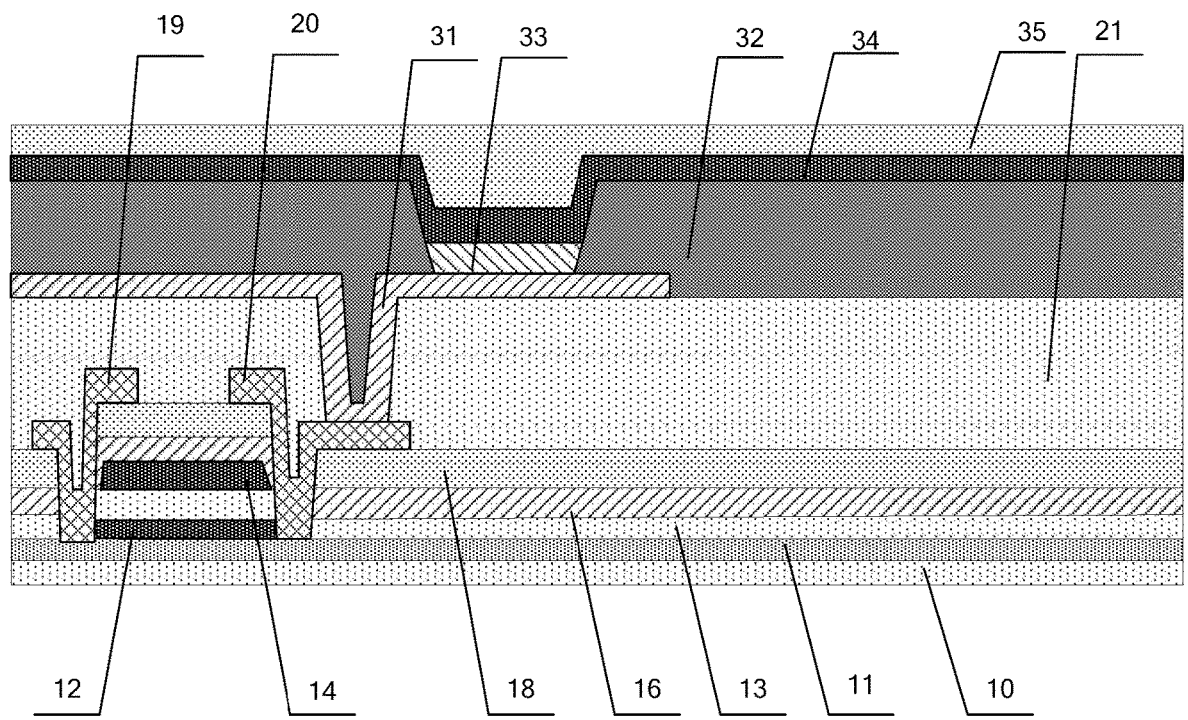
FIG. 13 is a schematic diagram of a display substrate according to another embodiment.
Figure 14:
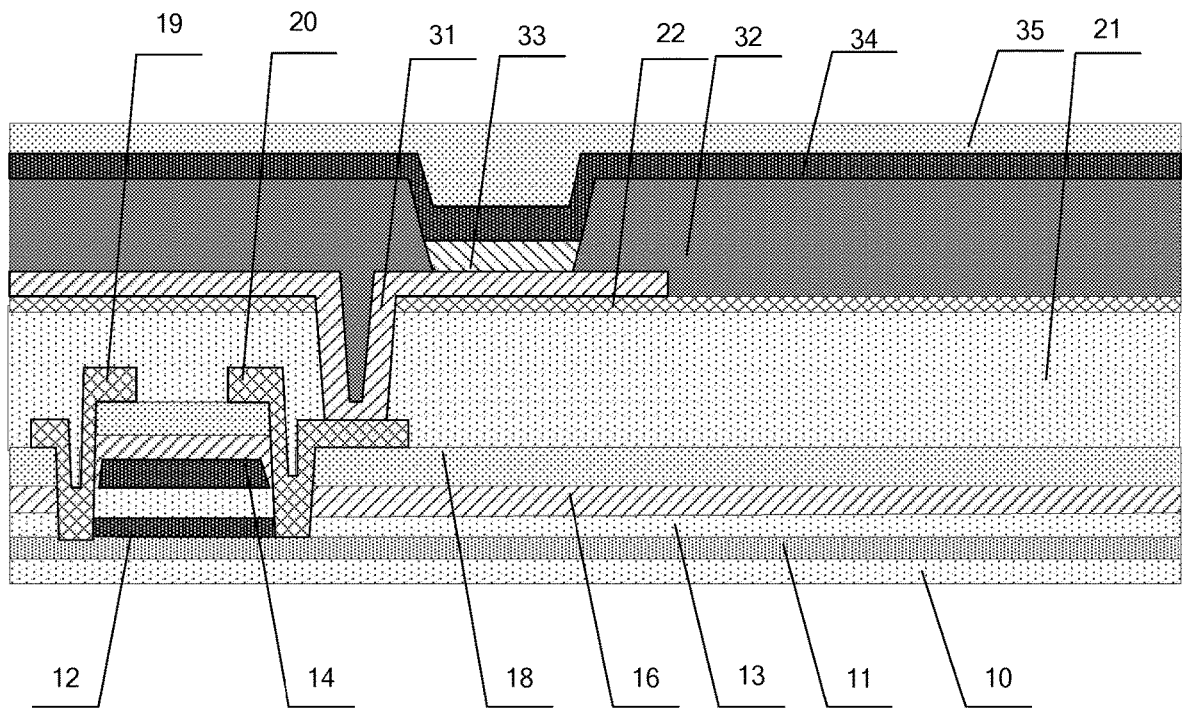
FIG. 14 is a schematic diagram of a display substrate according to yet another embodiment.

In an exemplary embodiment, the auxiliary layer 22 does not have to be provided. FIG. 13 is a schematic diagram of a display substrate according to another embodiment. As shown in FIG. 13 the display substrate provided in the present embodiment may comprise a substrate, and a drive structure layer, a planarization layer 21 and a light-emitting structure layer sequentially disposed on the substrate. The substrate may comprise a first substrate 10 and a buffer layer 11. The drive structure layer may comprise an active layer 12, a first insulating layer 13, a first gate electrode 14, a second insulating layer 16, a third insulating layer 18, a source electrode 19, and a drain electrode 20. The planarization layer 21 is provided with a first via exposing the drain electrode 20, and the first via is formed after curing, polishing and planishing the planarization layer 21. The light-emitting structure layer may comprise an anode 31, a pixel define layer 32, an organic light-emitting layer 33, and a cathode 34. The anode 31 is provided on a surface of the first auxiliary electrode 221 away from the substrate. The anode 31 is electrically connected to the drain electrode 20 through the first via.

In the display substrate provided by the embodiment, the planarization layer is cured, polished and planished, so that the planarization layer is flatter, thereby preventing color separation that causes uneven display. In addition, punching holes occurred after curing, polishing and planishing can prevent the residue of polishing agent (being acid or alkali, which may cause corrosion to some extent, thereby affecting TFT characteristics). On the other hand, compared with punching holes occurred before curing, the change of aperture may be reduced, the influence on contact resistance is avoided and the display effect is improved.

In an exemplary embodiment, the second auxiliary electrode 222 does not have to be provided. As shown in FIG.

14, the display substrate provided in this embodiment may comprise a substrate, and a drive structure layer, a planarization layer 21, an auxiliary layer 22 and a light-emitting structure layer sequentially disposed on the substrate. The substrate may comprise a first substrate 10 and a buffer layer 11. The drive structure layer may comprise an active layer 12, a first insulating layer 13, a first gate electrode 14, a second insulating layer 16, a third insulating layer 18, a source electrode 19, and a drain electrode 20. The planarization layer 21 is provided with a first via exposing the drain electrode 20, and the first via is formed after curing, polishing and planishing the planarization layer 21. The light-emitting structure layer comprises an anode 31, a pixel define layer 32, an organic light-emitting layer 33, and a cathode 34. The anode 31 may be provided on the surface of the auxiliary layer 22 away from the substrate and is electrically connected to the auxiliary layer 22; and the anode 31 is also electrically connected to the drain electrode 20 through the first via.

In the display substrate provided by the embodiment, the planarization layer is cured, polished and planished, so that the planarization layer is flatter, thereby preventing color separation that causes uneven display. In addition, punching holes occurred after curing, polishing and planishing can prevent the residue of polishing agent (being acid or alkali, which may cause corrosion to some extent, thereby affecting TFT characteristics). On the other hand, compared with punching holes occurred before curing, the change of aperture may be reduced, which may avoid affecting contact resistance and improve display effect. In addition, the auxiliary layer may be used as a mask during the manufacturing process, which simplifies the production process and reduces the cost. As an auxiliary electrode of an anode, the auxiliary layer can reduce IR drop.

Based on the technical concept of the embodiments of the present disclosure, an embodiment of the present disclosure also provides a display device, which comprises the display substrate as described in the abovementioned embodiment. The display device may be an OLED display device, or another display device. The display device may be any product or component with a display function such as a smart bracelet, a cell phone, a tablet computer, a television, a display, a laptop computer, a digital photo frame, and a navigator.

The following points need to be noted.
1) The drawings of the embodiments of the present disclosure only involve the structures involved in the embodiments of the present disclosure, and the other structures may refer to conventional designs.
2) For the sake of clarity, in the drawings used to describe embodiments of the present disclosure, the thickness of the layer or region is amplified or reduced, that is, the drawings are not drawn to actual scale. It is to be understood that when an element such as a layer, film, region or substrate is described as being "on" or "under" another element, it can be "directly" located "on" or "under" the other element or an intermediate element may exist.
3) The embodiments in the present disclosure, i.e., the features in the embodiments, may be combined with each other to obtain new embodiments if there is no conflict.

Although the embodiments disclosed in the present disclosure are as above, the described contents are only embodiments used for convenience of understanding the present disclosure and are not intended to limit the present disclosure. Any skilled person in the art to which the present disclosure pertains can make any modifications and variations in implementation manners and details without departing from the spirit and scope of the present disclosure. However, the protection scope of the present disclosure should be subject to the scope defined by the appended claims.

The invention claimed is:

1. A manufacturing method for a display substrate, comprising:
   forming a substrate, and forming a drive structure layer on the substrate, wherein the drive structure layer comprises a thin film transistor comprising a first electrode;
   forming a planarization layer on a side of the drive structure layer away from the substrate, forming a first via penetrating through the planarization layer and exposing the first electrode of the thin film transistor after curing, polishing and planishing the planarization layer; and
   forming an auxiliary layer comprising a first auxiliary electrode and a second auxiliary electrode independent of each other on a side of the planarization layer away from the substrate, wherein a material of the second auxiliary electrode is metal; and
   forming a light-emitting structure layer on a side of the auxiliary layer away from the substrate,
   wherein a material of the planarization layer is an anti-reflective material, and
   wherein forming the light-emitting structure layer on the side of the auxiliary layer away from the substrate comprises:
   forming a first electrode on a side of the auxiliary layer away from the substrate, wherein the first electrode is electrically connected to the first auxiliary electrode and the first electrode of the thin film transistor;
   forming a pixel define layer on a side of the first electrode away from the substrate, wherein the pixel define layer is provided with a second via exposing the second auxiliary electrode; and
   sequentially forming an organic light-emitting layer and a second electrode on a side of the pixel define layer away from the substrate, wherein the first electrode is directly connected to the first electrode of the thin film transistor through the first via, and outside the first via, the first electrode overlaps with at least a portion of the first auxiliary electrode, the second electrode is directly electrically connected to the second auxiliary electrode by a portion of the second electrode which is formed in the second via.

2. The manufacturing method of claim 1, wherein the auxiliary layer is sandwiched between the planarization layer and the light-emitting structure layer.

3. The manufacturing method of claim 2, wherein forming the first via penetrating the planarization layer and exposing the first electrode of the thin film transistor comprises: using the auxiliary layer as a mask to etch and form the first via.

4. The manufacturing method of claim 2, wherein a material of the auxiliary layer is metal.

5. The manufacturing method of claim 1, wherein the material of the planarization layer comprises a black material.

6. A display substrate, comprising:
   a substrate, and a drive structure layer, a planarization layer and a light-emitting structure layer sequentially disposed on the substrate, wherein the drive structure layer comprises a thin film transistor comprising a first electrode, the planarization layer is provided with a first via exposing the first electrode of the thin film transistor, and the first via is formed after curing, polishing and planishing the planarization layer, wherein a material of the planarization layer is an anti-reflective material, the display substrate further comprises an auxiliary layer sandwiched between the planarization layer and the light-emitting structure layer, the auxiliary layer comprises a first auxiliary electrode and a second auxiliary electrode which are independent of each other, and a material of the second auxiliary electrode is metal;

the light-emitting structure layer comprises a first electrode, a pixel define layer, an organic light-emitting layer and a second electrode arranged in sequence from a side close to the auxiliary layer to a side away from the auxiliary layer, wherein the first electrode is electrically connected to the first electrode of the thin film transistor through the first via, and the first electrode is electrically connected to the first auxiliary electrode; the pixel define layer is provided with a second via exposing the second auxiliary electrode; wherein the first electrode is directly connected to the first electrode of the thin film transistor through the first via, and outside the first via, the first electrode overlaps with at least a portion of the first auxiliary electrode, the second electrode is directly electrically connected to the second auxiliary electrode by a portion of the second electrode which is formed in the second via.

7. The display substrate of claim 6, wherein a material of the auxiliary layer is metal.

8. The display substrate of claim 7, wherein the first electrode is disposed on a surface of the first auxiliary electrode.

9. The display substrate of claim 7, wherein the material of the planarization layer comprises a black material.

10. The display substrate of claim 6, wherein the first electrode is disposed on a surface of the first auxiliary electrode.

11. The display substrate of claim 6, wherein the material of the planarization layer comprises a black material.

12. A display device, comprising the display substrate of claim 6.

* * * * *